United States Patent [19]
Stumfall et al.

[11] Patent Number: 6,011,322
[45] Date of Patent: Jan. 4, 2000

[54] APPARATUS AND METHOD FOR PROVIDING POWER TO CIRCUITRY IMPLEMENTING TWO DIFFERENT POWER SOURCES

[75] Inventors: David M. Stumfall, Santa Ana; Kazutoyo Sekine, Irvine, both of Calif.

[73] Assignees: Sony Corporation, Tokyo, Japan; Sony Trans Com, Inc., Irvine, Calif.

[21] Appl. No.: 08/901,326

[22] Filed: Jul. 28, 1997

[51] Int. Cl.$^7$ ................. H02J 1/00; G06F 1/00; G11C 7/00

[52] U.S. Cl. .................. 307/43; 365/226; 395/750.01

[58] Field of Search .................. 307/43, 44, 64, 307/66, 85, 86, 87, 112, 125, 130, 139, 140; 395/750.01, 750.02, 750.03, 750.04, 750.05, 750.06, 750.07, 750.08; 365/226, 227, 228, 229

[56] References Cited

U.S. PATENT DOCUMENTS 4,730,122  3/1988  Dreielbis et al. .................. 307/130
5,515,134  5/1996  Taguchi .................. 354/484
5,732,914  3/1998  Nakayama et al. .................. 307/125

*Primary Examiner*—Richard T. Elms
*Attorney, Agent, or Firm*—Blakely, Sokoloff, Taylor & Zafman LLP

[57] ABSTRACT

An apparatus and method for providing power control in an in-flight entertainment system is disclosed. The power control circuit comprises a first power supply that supplies a first voltage and a second power supply that supplies a second voltage. The circuit further comprises a detector circuit having an input terminal is coupled to the first power supply, and an output terminal that is coupled to the second power supply. The detector circuit generates a first signal upon detection of a valid first voltage level. A control circuit is coupled to the first power supply and the output terminal of the detector circuit. The control circuit is enabled upon receipt of the first signal. A processing circuit is coupled to the second power supply and the control circuit, wherein the second power supply provides the second voltage to the processing circuit upon receipt of the first signal, and the control circuit issues an enable signal to the processing circuit when the processing circuit has received the second voltage.

20 Claims, 4 Drawing Sheets

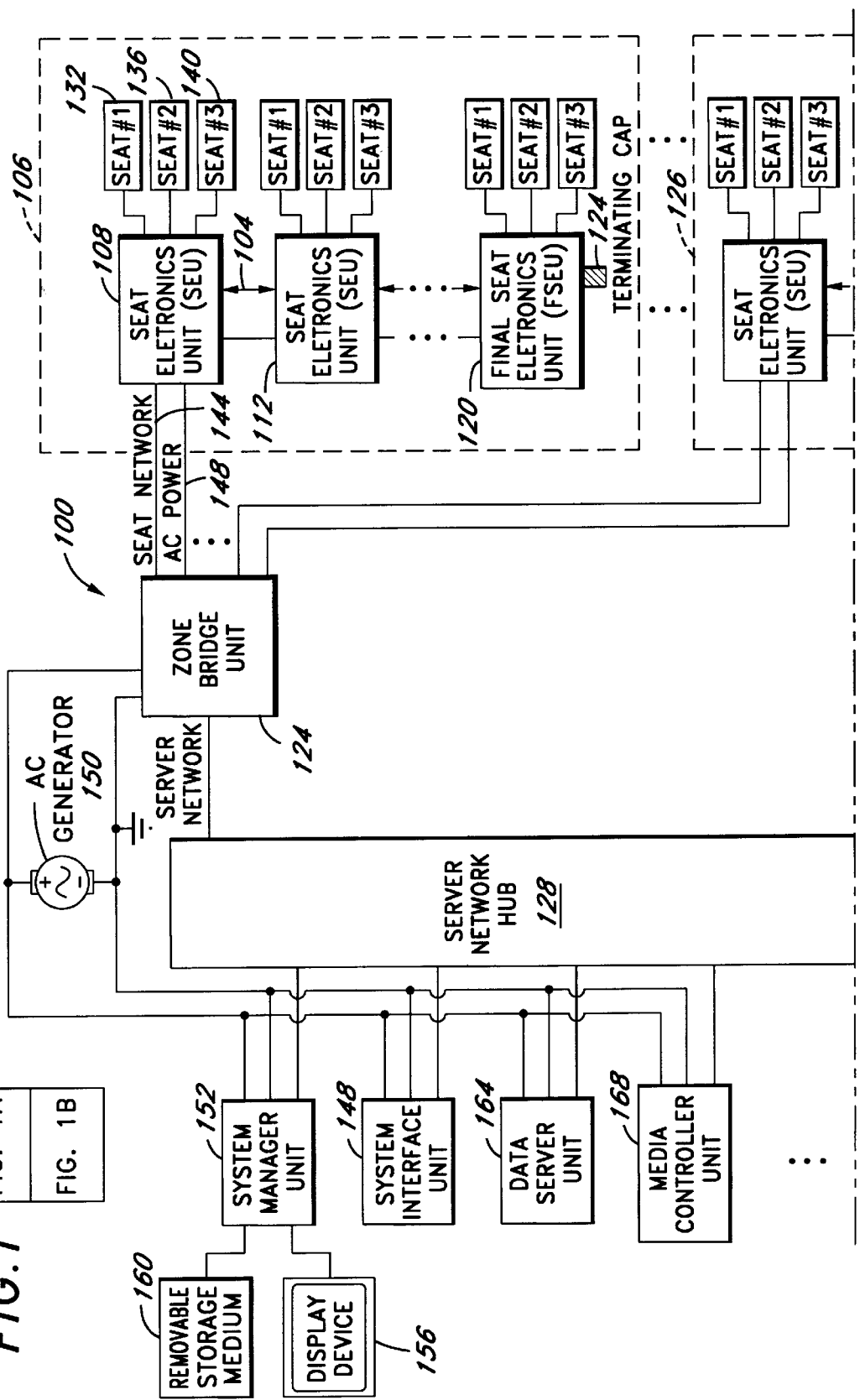

FIG. 3A
+5V POWER SUPPLY
210

$t_0$

FIG. 3B
VOLTAGE DETECTOR
214

$t_1$

FIG. 3C
+3V POWER SUPPLY
212

$t_2$

FIG. 3D
MICROCONTROLLER
216

FIG. 3E
PROCESSOR
226

$t_3$

FIG. 4A
+12V DC REGULATOR
190

$t'_0$  $t'_1$

FIG. 4B
+5V POWER SUPPLY
210

$t'_2$

FIG. 4C
VOLTAGE DETECTOR
214

FIG. 4D
+3.3V POWER SUPPLY
212

$t'_3$

APPARATUS AND METHOD FOR PROVIDING POWER TO CIRCUITRY IMPLEMENTING TWO DIFFERENT POWER SOURCES

BACKGROUND OF THE INVENTION

1. Field of the Invention

The present invention relates to power supplies. More particularly, the present invention relates to a method and apparatus of providing power to circuitry utilizing two different power sources.

2. Description of the Related Art

Over the past few decades, commercial aircraft has become a necessary mode of travel for personal and business reasons. To improve passenger comfort, commercial aircraft typically offer a number of entertainment activities that can be enjoyed by the passenger, such as video games, movies and various selections of music. In addition, various electronic systems for supporting communications and/or other in-flight functions are provided.

Such electronic systems typically comprise electronic units which receive in-flight entertainment programs from a central system and which subsequently deliver these programs to one or more passengers on the aircraft. These electronic units typically include circuitry which draw power from two different power sources, such as a +5 V power supply and a +3.3 V power supply which in turn obtain power from a 12 V regulator. The +5 V and +3.3 V power supplies typically provide the current and voltage requirements of microcontrollers and processors respectively. When operational, the microcontroller issues a control signal to the processor to reset, to boot or to initialize the processor. However, in such conventional systems, the control signal issued by the microcontroller is sometimes issued to the processor before the processor has been powered up or before the integrity of the processor has been validated. The control signal is then treated as an invalid request and the processor remains in an unreset, unbooted or uninitialized state even upon powering up.

Moreover in such conventional systems, when the output of the 12 V regulator is terminated, the +5 V power supply is typically terminated before the +3.3 V power supply is terminated. This may result in damaging circuits which are still operating on the +3.3 V power supply, if back biasing of various components in those circuits, as provided by the +5 V power supply, is terminated.

Accordingly, there is a need in the technology for an apparatus and method for providing power utilizing two different power sources, so that circuitry relying on both power sources may issue appropriately-timed control signals, to maintain circuit integrity when either one of the power supplies is turned off.

BRIEF SUMMARY OF THE INVENTION

An apparatus and method for providing power control in an in-flight entertainment system is disclosed. The power control circuit comprises a first power supply that supplies a first voltage and a second power supply that supplies a second voltage. The circuit further comprises a detector circuit having an input terminal is coupled to the first power supply, and an output terminal that is coupled to the second power supply. The detector circuit generates a first signal upon detection of a valid first voltage level. A control circuit is coupled to the first power supply and the output terminal of the detector circuit. The control circuit is enabled upon receipt of the first signal. A processing circuit is coupled to the second power supply and the control circuit, wherein the second power supply provides the second voltage to the processing circuit upon receipt of the first signal, and the control circuit issues an enable signal to the processing circuit when the processing circuit has received the second voltage.

BRIEF DESCRIPTION OF THE DRAWINGS

FIGS. 1A and 1B together show an overall schematic view of a flight entertainment system 100 which implements the power control system of the present invention.

FIGS. 3A–3E are a timing diagram illustrating one aspect of the power control process of the present invention.

FIGS. 4A–4D are a timing diagram illustrating a second aspect of the power control process of the present invention.

DETAILED DESCRIPTION OF THE INVENTION

Figure 1B:
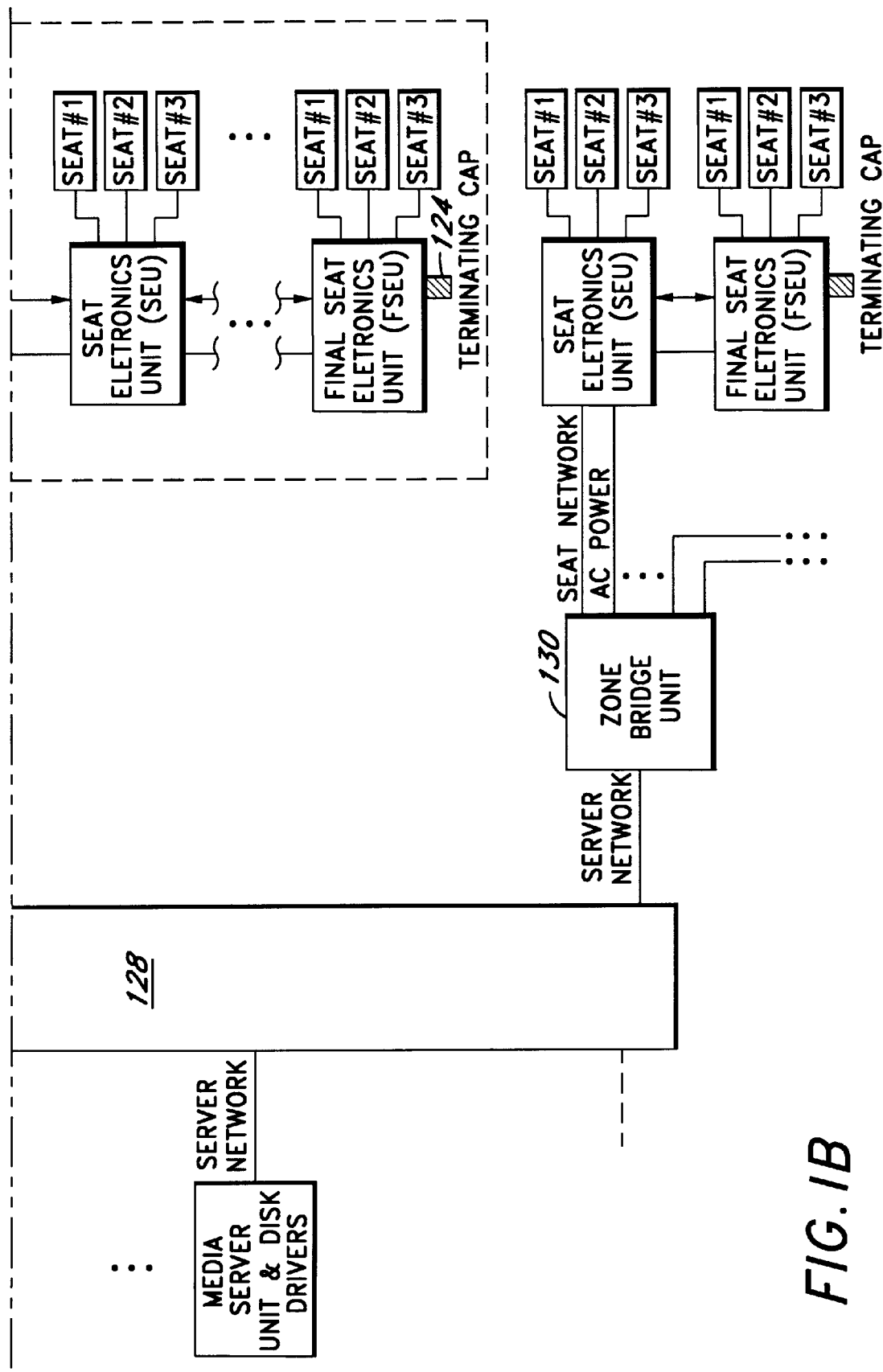

FIGS. 1A and 1B together show an overall schematic view of a flight entertainment system 100 which implements the power control system of the present invention. The flight entertainment system 100 includes an interconnect bus 104, a daisy chain 106 of interconnecting seat electronic units (SEUs) 108, 112, 120 and a terminating cap 124. Each daisy chain 106 is connected such that the output of one SEU is connected to the input of the next SEU until the final seat electronics unit (FSEU) 120 is reached. The SEUs receive the audio and video signals from a Zone Bridge Unit (ZBU) 124. Each ZBU 124 supports multiple daisy chains 106, 126. A Server Network Hub 128 coordinates and communicates the information to and from multiple ZBUs 124, 130 to supporting electronics.

Each SEU, e.g. SEU 108, provides the necessary audio and video signals to support a number of passenger seats 132, 136, 140 in the passenger compartment of an aircraft. In one embodiment, an SEU may support two to three passenger seats depending on the aircraft configuration used. In the described embodiment, up to 12 SEUs are daisy chained together although the number of SEUs in a daisy chain may vary.

Each ZBU 124 services one section or zone of an aircraft. A ZBU 124 may service multiple daisy chains 106, 126. In one design, daisy chain 106, 126 may serve an aisle of a plane while each ZBU 124 serves a plane section. The bus which forms each daisy chain 106, is terminated at the FSEU 120. The FSEU includes terminating cap 124 which terminates interconnect bus 104.

ZBU 124 distributes audio and video data on a seat network bus 144 and power along AC power line 148 to the various SEUs 108, 112. In one embodiment, power is provided by an AC generator 150 located on the aircraft. The system may also receive data, such as credit card information, entertainment requests, or merchandise orders, from seat electronics (not shown) in the vicinity of passenger seat 132, 136, 140. The respective SEU unit 108 receives the data and may then transfer the data to the respective ZBU 124 via seat network bus 144. This information may be further transmitted through the server network hub 128 to other electronics aboard the aircraft, or in the case of telephone or other communication to a public switched telephone network ("PSTN") or other external networks outside of the aircraft through a system interface unit 148. A system manager unit (SMU) 152 oversees operation of the IFE. The SMU 152 is coupled to a display device 156 which displays passenger requests and system status information. A floppy drive 160 is also provided for storing data.

The IFE, including the SMU 152 and the SEUs 108, 112, 120 is designed to perform self diagnostic checks. In particular, the SEUs perform diagnostic checks and may forward error messages to the SMU. The SMU 152 then displays the error on display device 156 or the information is stored on a floppy disk or other removable storage medium 160 for further use or analysis. This information enables technicians or maintenance personnel to quickly troubleshoot the IFE system. The server network hub 128 may further be coupled to other units which provide information such as Data Server Units (DSUs) 164 and Media Controller Units (MCUs) 168 which provide the video/audio contact.

In a preferred embodiment, the power control system 200 (FIG. 2) of the present invention may be used in controlling the supply of current and voltage to electronic systems which provide in-flight entertainment services such as those shown in FIGS. 1A and 1B. These electronic systems include, but are not limited to, SEUs 108, 112, 120, System Manager Unit 152, System Interface Unit 148, Data Server Unit 164, and Media Controller Unit 168. As is apparent to one of ordinary skill in the technology, the power control system 200 of the present invention may be implemented in any system that utilizes current or voltage from two different power sources, and is not limited to in-flight entertainment systems.

Figure 2:
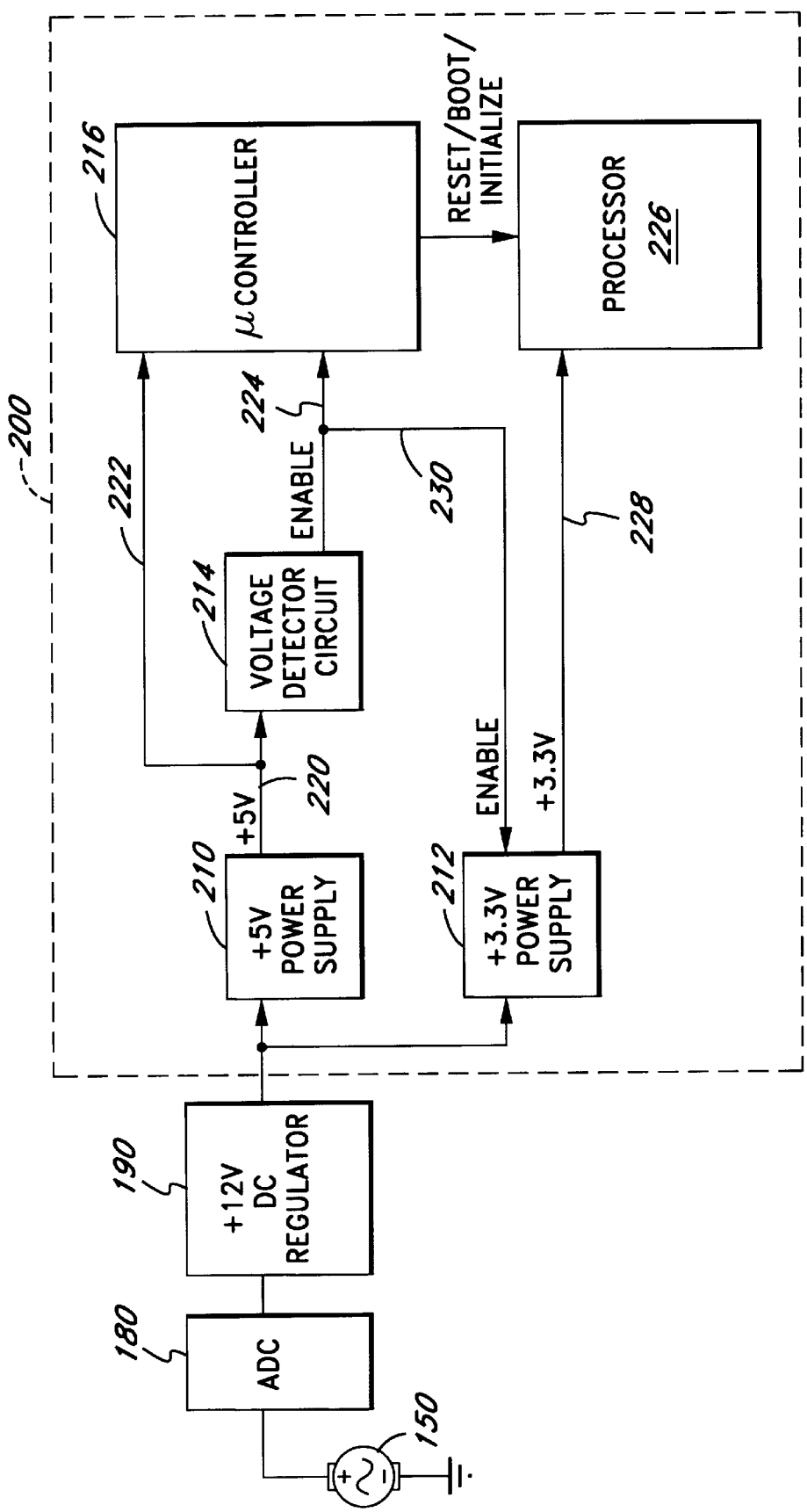
FIG. 2 is a detailed block diagram of the power control system 200 of the present invention.

FIG. 2 is a detailed block diagram of the power control system 200 of the present invention. The power control system 200 comprises a first power supply 210 and a second power supply 212. An example of the first and the second power supplies 210 and 212 include a +5 V and a +3.3 V power supply, respectively. In one embodiment, the first and second power supplies 210 and 212 provide regulated current and voltage obtained from a +12 V dc power regulator 190. The dc power regular 190 in turn obtains supply current and voltage from the AC generator 150 via an AC-to-DC converter 180.

The first power supply 210 provides current and voltage to a voltage detector 214 and a microcontroller 216 via lines 220 and 222 respectively. Upon detection of a valid +5 V signal, the voltage detector 214 issues a control signal via signal line 224 to enable the microcontroller 216. An example of the microcontroller 216 is that marketed by Intel Corp. under the part designation I196. It is understood by one of ordinary skill in the art that the microcontroller 216 may be implemented using any microcontroller which obtains current and voltage from a +5 V source.

The second power supply 212 provides supply current and voltage to a processor 226 via line 228. In one embodiment, the processor is a central processing unit. It is apparent to one of ordinary skill in the art that the second power supply 212 may also be configured to provide current and voltage to a plurality processors. The voltage detector 214 also issues an enable signal to the second power supply 212 via signal line 230 upon detection of a valid +5 V signal. When enabled, the microcontroller 216 issues a signal to the processor 226 via signal line 232 to reset, to boot or to initialize the processor 226. However, this signal is only issued after the processor 226 is powered up by the second power supply 212, to ensure that the processor 226 is in a state to properly receive and to process the signal. An example of the processor 226 is the Pentium processor, the 486 processor as marketed by Intel Corp. Other examples of the processor 226 include the K6 processor or the 586 processor as marketed by AMD, and the M2 processor as marketed by Cyrix Corp. It is understood by one of ordinary skill in the art that the processor 226 may be implemented using any processor which obtains current and voltage from a +3.3 V source.

FIGS. 3A–3E are timing diagrams illustrating the operational sequence of one aspect of the power control system 200 of the present invention. With reference to FIG. 3A, the first power supply 210 is enabled to provide current and voltage to the voltage detector 114 and microcontroller 216. At time $t_0$ the output of the first power supply 210 reaches a valid +5 V level. Shortly after this point, at time $t_1$, the voltage detector 214 issues an enable signal via line 224 to enable both the microcontroller 216 and the second power supply 212 via signal lines 224 and 230, respectively (see FIGS. 3B and 3D). At time $t_2$, the output of the second power supply 212 reaches a valid +3.3 V level (see FIG. 3C). At this point (time $t_2$), the microcontroller 216 issues an enable signal to processor 226 to reset, to boot or to initialize the processor 226. At time $t_3$, the processor is reset, booted or initialized (see FIG. 3E). In this manner, the processor 226 will always receive the enable signal after it is powered up by the second power supply 212. As a result, the enable signal will not be considered invalid.

FIGS. 4A–4D are timing diagrams illustrating the operational sequence of a second aspect of the power control system 200 of the present invention. FIG. 4A illustrates the voltage output of the 12 V power regulator 190 during a power down sequence. As shown, the 12 V power regulator 190 source gradually tapers off from the +12 V level, beginning at a time $t'_0$. Upon reaching a level, at $t'_1$, representative of an invalid +12 V signal, the first power supply 210 begins to power down (FIG. 4B). When the output of the first power supply 210 reaches a level indicative of an invalid signal +5 V (at time $t'_2$), the voltage detector 214 issues a disable signal to the second power supply 212 and the microcontroller 216. In response, the second power supply 212 begins to power down. At time $t'_3$, the output of the second power supply 212 reaches a level representative of an invalid +3.3 V signal, and circuitry powered by the second power supply 212, including the processor 226, are powered down. The circuitry driven by the second power supply 212 will thus be powered down very shortly after the first power supply 210 has powered down, and preferably before the output of the first power supply 210 has reached the +3.3 V level. As a result, any potential damage caused by the termination of back biasing provided by the first power (+5 V) supply 210 to circuitry which is also driven by the second (+3.3 V) power supply 212, will be eliminated or minimized. In a preferred embodiment, the period of time between $t'_2$ and $t'_3$ is 10 ms.

Through the implementation of the principles of the present invention, circuitry utilizing two power supplies may be appropriately enabled. In addition, the implementation of the present invention ensures that circuit integrity will be maintained when the power supplies are turned off.

The present invention may be embodied in other specific forms without departing from its spirit or essential characteristics. The described embodiments are to be considered in all respects only as illustrative and not restrictive. The scope of the invention is, therefore, indicated by the appended claims rather than the foregoing description. All changes which come within the meaning and range of equivalency of the claims are to be embraced within their scope.

What is claimed is:

1. A power control circuit in an in-flight entertainment system, comprising:
    a first power supply for providing a first voltage;
    a second power supply for providing a second voltage;
    a detector circuit having an input terminal coupled to said first power supply, said detector circuit having an output terminal coupled to said second power supply, said detector circuit generates a first signal upon detection of a valid first voltage level;
    a control circuit coupled to said first power supply and said output terminal of said detector circuit, said control circuit being enabled upon receipt of the first signal; and
    a processing circuit coupled to said second power supply and said control circuit, wherein said second power supply provides said second voltage to said processing circuit upon receipt of the first signal, and said control circuit issues an enable signal to said processing circuit when said processing circuit has received said second voltage.

2. The circuit of claim 1, wherein said detector circuit is a voltage detector circuit.

3. The circuit of claim 1, wherein said control circuit is a microcontroller.

4. The circuit of claim 1, wherein said processing circuit is a central processing unit.

5. The circuit of claim 1, wherein the first voltage is +5 volts.

6. The circuit of claim 1, wherein the second voltage is +3.3 V.

7. The circuit of claim 1, wherein said detector circuit further generates a second signal upon detection of an invalid first voltage level, and wherein said second power supply terminates said second voltage to said processing circuit upon receipt of the second signal.

8. The circuit of claim 1, wherein said processing circuit is reset upon receipt of said enable signal.

9. The circuit of claim 1, wherein said processing circuit is booted upon receipt of said enable signal.

10. The circuit of claim 1, wherein said processing circuit is initialized upon receipt of said enable signal.

11. A method of controlling the supply of power in an in-flight entertainment system, comprising the steps of:
    providing a first voltage to a control circuit and a detector circuit;
    detecting the presence of a valid first voltage;
    providing a second voltage to a processing circuit and enabling the control circuit upon said detecting the presence of a valid first voltage, and
    issuing an enable signal to said processing circuit when said processing circuit has received said second voltage.

12. The method of claim 11, wherein in the step of detecting, said first valid voltage is detected by a voltage detector circuit.

13. The method of claim 11, wherein in the step of providing a first voltage, said control circuit is a microcontroller.

14. The method of claim 11, wherein in the step of providing a second voltage, said processing circuit is a central processing unit.

15. The method of claim 11, wherein in the step of providing a first voltage, the first voltage is +5 volts.

16. The method of claim 11, wherein in the step of providing a second voltage, the second voltage is +3.3 V.

17. The method of claim 11, further comprising the steps of:
    providing a second signal when said first voltage is invalid; and
    terminating said second voltage upon receipt of said second signal.

18. The method of claim 11, further comprising the step of resetting said processing circuit upon receipt of said enable signal.

19. The method of claim 11, further comprising the step of booting said processing circuit upon receipt of said enable signal.

20. The method of claim 11, further comprising the step of initializing said processing circuit upon receipt of said enable signal.

* * * * *

UNITED STATES PATENT AND TRADEMARK OFFICE
CERTIFICATE OF CORRECTION

PATENT NO. : 6,011,322
DATED : January 4, 2000
INVENTOR(S) : Stumfall et al.

It is certified that error appears in the above-identified patent and that said Letters Patent is hereby corrected as shown below:

In column 3 at line 58 insert --of-- after "plurality"

Signed and Sealed this

Twenty-seventh Day of March, 2001

Attest:

NICHOLAS P. GODICI

Attesting Officer    Acting Director of the United States Patent and Trademark Office